United States Patent [19]

Kubota et al.

[11] Patent Number: 5,134,588
[45] Date of Patent: Jul. 28, 1992

[54] SEMICONDUCTOR MEMORY DEVICE

[75] Inventors: Yasushi Kubota, Sakurai; Katsuji Iguchi, Yamatokoriyama, both of Japan

[73] Assignee: Sharp Kabushiki Kaisha, Japan

[21] Appl. No.: 558,328

[22] Filed: Jul. 27, 1990

[51] Int. Cl.$^5$ .............................................. G11C 13/00
[52] U.S. Cl. ....................................... 365/207; 365/63
[58] Field of Search ................ 365/207, 63, 189.01, 365/230.01

[56]  References Cited

U.S. PATENT DOCUMENTS

4,546,457  10/1985  Nozaki et al. ..................... 365/207

*Primary Examiner*—Terrell W. Fears
*Attorney, Agent, or Firm*—Nixon & Vanderhye

[57]  ABSTRACT

A semiconductor memory device of a type comprising a plurality of sense amplifiers of differential type arranged in one direction, a pair of bit lines extending outwardly from opposite sides of each of the sense amplifiers, a plurality of word lines extending in a direction intersecting the bit lines, and a memory cell disposed at each of intersecting points between the bit lines and the word lines. The device is characterized in that the memory cells which are connected respectively with the neighboring bit lines are connected with the different word lines. Therefore, not only can the interference noise between each bit-line pair be reduced, but also any possible erroneous operation can be eliminated, thereby increasing the data reading speed.

3 Claims, 8 Drawing Sheets

SEMICONDUCTOR MEMORY DEVICE

BACKGROUND OF THE INVENTION

1. Field of the Invention

The present invention relates to a semiconductor memory device of a type designed to reduce noises resulting from a capacitance coupling between the neighboring bit lines.

2. Description of the Prior Art

Figure 12:
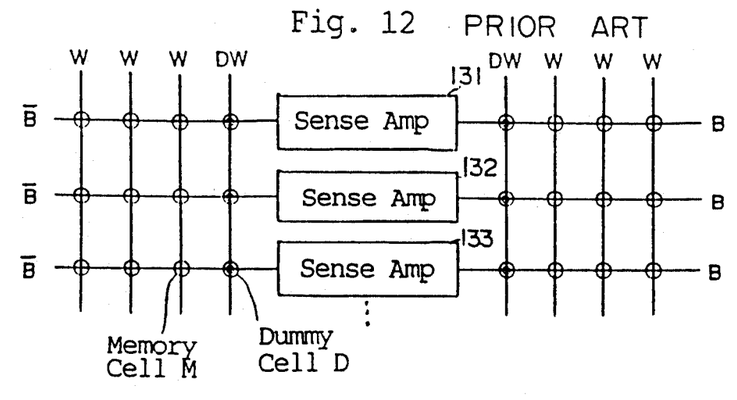
FIGS. 12, 13 and 14 are schematic diagrams showing the prior art semiconductor memory devices of open bit-line architecture, folded bit-line architecture and twisted bit-line architecture types, respectively.
Figure 13:
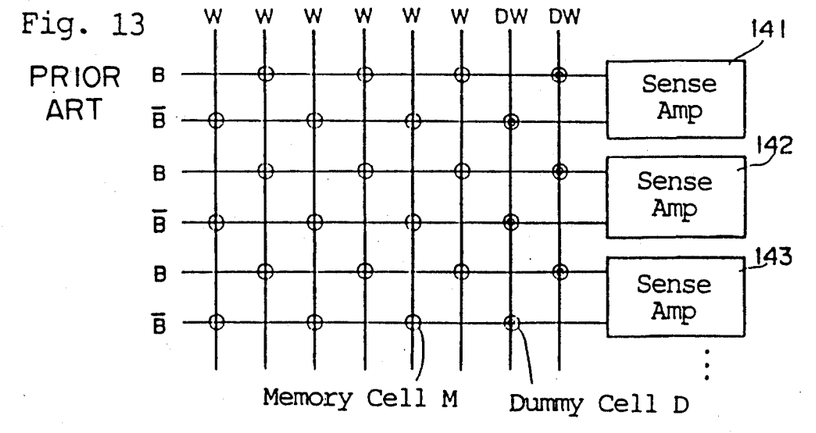

Examples of prior art semiconductor memory devices are shown in FIGS. 12 and 13, respectively. The prior art semiconductor memory device shown in FIG. 12 is generally referred to as an open bit-line architecture and comprises a plurality of sense amplifiers (only three of which are shown by 131, 132 and 133) of differential type arranged in one direction, bit lines B and $\bar{B}$ extending outwardly from opposite sides of each sense amplifier 131, 132 and 133, a plurality of word lines W and a dummy word line DW both intersecting the bit lines B, and a plurality of word lines W and a dummy word line DW intersecting the bit lines $\bar{B}$. At the intersection between each bit line B or $\bar{B}$ and each word line W, a memory cell M (as indicated by the single circle) is disposed and connected with the respective bit line B or $\bar{B}$ and the respective word line W and, similarly, at the intersection between each bit line B or $\bar{B}$ and each dummy word line DW, a dummy cell D (as indicated by the double circle) is disposed and connected with the respective bit line B or $\bar{B}$ and the respective dummy word line DW.

The prior art semiconductor memory device shown in FIG. 13 is generally referred to as a folded bit-line architecture and comprises a plurality of sense amplifiers (only three of which are shown by 141, 142 and 143), a pair of bit lines B and $\bar{B}$ extending outwardly from one side of each sense amplifier 141, 142 and 143, a plurality of word lines W and a dummy word line DW intersecting the bit lines B and $\bar{B}$ of each pair. At the intersection between each word line W and each of the bit lines B and $\bar{B}$ of each pair, a memory cell M is disposed and connected with the respective word line W and the respective bit line B or $\bar{B}$ and, similarly, at the intersection between each bit line B or $\bar{B}$ and the dummy word line DW, a dummy cell is disposed and connected with the respective bit line B or $\bar{B}$ and the dummy word line DW. So that the memory cell M and the dummy cell D connected with the bit lines B and $\bar{B}$ of each pair will not be selected simultaneously by the single word line W, the memory cells and the dummy cells on the bit lines B and $\bar{B}$ of all pairs are so disposed as to intersect alternating members of the word lines W.

The semiconductor memory device of open bit-line architecture shown in FIG. 12 operates in the following manner. At the outset, when one of the word lines W is selected according to an input address signal, the dummy cells D connected with one of the dummy word lines DW which is positioned on one side of each sense amplifier 131, 132 and 133 opposite to the side adjacent said one of the word lines W are charged to a reference potential (which is normally a voltage intermediate between "H" and "L"). Then, after the paired bit lines B and $\bar{B}$ have been charged (precharged) to the same potential, said word line W and said dummy word line DW are activated to conduct the memory cells M and the dummy cells D, connected respectively therewith, to said paired bit lines B and $\bar{B}$. Once this occurs, potential differences are created between the paired bit lines B and $\bar{B}$ by the action of the charge stored on the memory cells and the dummy cells D, which difference is differentially amplified by the associated sense amplifiers 131, 132 and 133, wherefore one of the paired bit lines which is held at a higher potential is equalized to the potential of an electric power source while the other of the paired bit lines which is held at a lower potential is equalized to a zero potential. Where the semiconductor memory device operates in this way, the potential at the bit line B or the bit line $\bar{B}$ fluctuates according to the contents of data stored in the memory cells M then brought into a conductive state and, therefore, the case would occur in which the potential at the neighboring bit line B or the neighboring bit line $\bar{B}$ varies in an opposite phase. In such case, the potential difference between the paired bit lines B and $\bar{B}$ will be reduced by the effect of an interference noise resulting from a capacitance coupling between the neighboring bit lines B or the neighboring bit lines $\bar{B}$, causing the sense amplifiers 131, 132 and 133 to operate erroneously or resulting in a reduction in the data reading speed.

On the other hand, in the prior art semiconductor memory device of folded bit-line architecture shown in FIG. 13, it may occur that a potential variation occurring in the bit lines B and $\bar{B}$ extending respectively from the sense amplifier 142 and the sense amplifier 141, which are neighboring with each other, and a potential variation occurring in the bit lines B and $\bar{B}$ extending respectively from the sense amplifier 142 and the sense amplifier 143 which are neighboring with each other, will be opposite in phase to each other. Once this occur, the sense amplifier 142 will operate erroneously, or it may constitute a cause of reduction in a reading speed. In addition, in the case of this folded bit-line architecture, since during the operation respective potential variations occurring on the bit lines B and $\bar{B}$ of a pair associated with, for example, the sense amplifier 142 will become opposite in phase to each other, this may cause the sense amplifier to operate erroneously or it may constitute a cause of reduction in reading speed.

Figure 14:
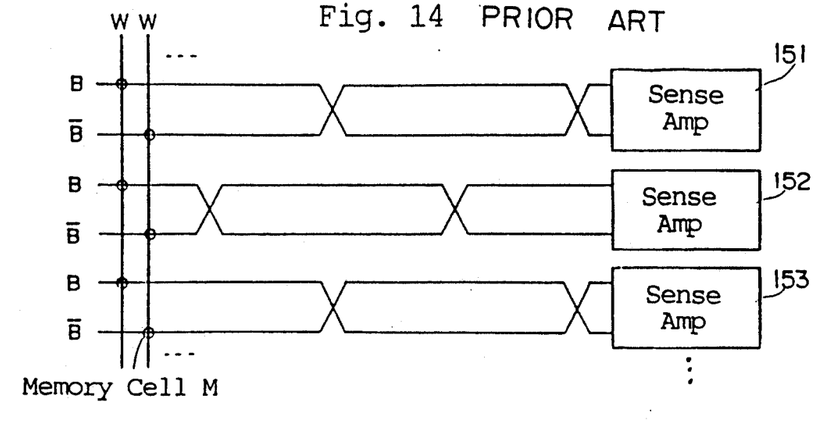

In view of the problem inherent in the folded bit-line architecture, a sophisticated version thereof has been develpped, which is known as a twisted bit-line architecture. The prior art semiconductor memory device of twisted bit-line architecture is shown in FIG. 14, wherein each pair of bit lines B and $\bar{B}$ extending outwardly from each of a plurality of sense amplifiers (only three of which are shown by 151, 152 and 153) are twisted. According to the twisted bit-line architecture, one pair of the bit lines B and $\bar{B}$ and another pair of the bit lines B and $\bar{B}$ are averagely spaced an equal distance from each other and, therefore, an interference nose resulting from the bit lines B or the bit lines $\bar{B}$ extending from, for example, the neighboring sense amplifiers 151 and 153 will match in phase with and be equal in magnitude to the paired bit lines B and $\bar{B}$ extending from the sense amplifier 152. Because of this, although the influence of the neighboring bit lines B and $\bar{B}$ will be small as compared with that in the folded bit-line architecture, the interference noise between the paired bit lines B and $\bar{B}$ associated with the same sense amplifier 152 will not be removed and, therefore, the sense amplifier tends to operate erroneously, accompanied by a reduction in reading speed.

SUMMARY OF THE INVENTION

Accordingly, the present invention has been devised to provide an improved semiconductor memory device of a type wherein any possible occurrence of the erroneous operation of the sense amplifier is substantially eliminated by reducing the interference noise resulting from the capacitance coupling between the bit lines, that is, the inter-bit-line coupling capacitance, thereby to increase the data reading speed.

To this end, the present invention provides a semiconductor memory device which comprises a plurality of sense amplifiers of differential type arranged in one direction, a pair of bit lines extending outwardly from opposite sides of each of the sense amplifiers, a plurality of word lines extending in a direction intersecting the bit lines, and a memory cell disposed at each of intersecting points between the bit lines and the word lines. In accordance with the present invention, the semiconductor memory device of the type referred to above is featured in that the memory cells which are connected respectively with the neighboring bit lines are connected with the different word lines.

Preferably, the semiconductor memory device may further comprise switches connected with bit-line selection lines disposed between the sense amplifiers and the associated bit lines. In this case, each of the switches connected with the neighboring bit lines are connected with the different bit-line selection lines.

Also, it is preferable that the sense amplifiers are arranged in a plurality of rows with the neighboring bit lines extending outwardly from the sense amplifiers in the neighboring rows.

According to the present invention, since the memory cells connected with the neighboring bit lines are connected with the different word lines, there is no possibility that, in the event that one of the word lines is selected, the memory cells connected with the neighboring bit lines may be brought into a conductive state simultaneously. Accordingly, one of the neighboring bit lines which is not brought into a conductive state has a potential retained at the potential to which the precharging has been effected, when the sense amplifier to which such one of the neighboring bit lines is connected is not driven. Accordingly, the interference noise resulting from the inter-bit-line coupling capacitance can be minimized, accompanied by the elimination of any possible erroneous operation of the sense amplifier, thereby to increase the data reading speed.

Where the switches connected with the bit-line selection lines are disposed between the sense amplifiers and the associated bit lines and each of the switches connected with the neighboring bit lines are connected with the different bit-line selection lines, one of the neighboring bit lines which is not brought into the conductive state is maintained at a potential equal to the potential to which the precharging has been effected, if one of the switches which is connected with one of the neighboring bit lines having the memory cell in the conductive state is switched on and the switch which is connected with the other of the neighboring bit lines which is not in the conductive state is switched off. Accordingly, even in the case where the neighboring sense amplifiers are simultaneously driven, the interference noise resulting from the inter-bit-line coupling capacitance can be minimized, accompanied by the elimination of any possible erroneous operation of the sense amplifier, thereby to increase the data reading speed.

Where the sense amplifiers are arranged in a plurality of rows with the neighboring bit lines extending outwardly from the sense amplifiers in the neighboring rows, it suffices that all of the sense amplifiers which are connected with the bit lines having the memory cells brought into the conductive state are all driven and, on the other hand, all of the sense amplifiers which are connected with the bit lines having the memory cells not brought into the conductive state are not driven. In this example, a drive circuit for the sense amplifiers can be advantageously simplified and more compact than that required where the sense amplifiers are arranged in a single row.

BRIEF DESCRIPTION OF THE DRAWINGS

This and other objects and features of the present invention will become clear from the following description taken in conjunction with preferred embodiments thereof with reference to the accompanying drawings, in which.

DETAILED DESCRIPTION OF THE EMBODIMENTS

Figure 1:
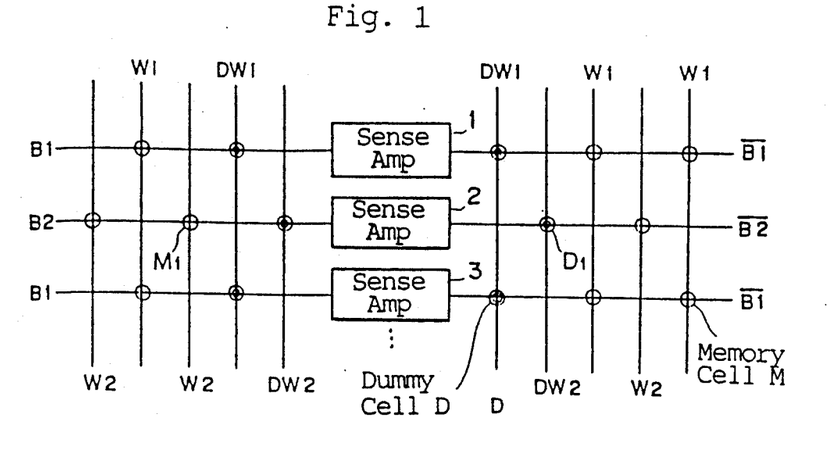
FIGS. 1, 2, 3, 5, 7 and 9 are schematic diagrams showing respective semiconductor memory devices according to first, second, third, fourth, fifth and sixth preferred embodiments of the present invention.

FIG. 1 illustrates a semiconductor memory device according to a first preferred embodiment of the present invention, which is of an open bit-line scheme. This semiconductor memory device comprises a plurality of sense amplifiers (only three of which are shown by 1, 2 and 3) arranged in one row extending in one direction; a pair of bit lines B1 and $\overline{B1}$ extending outwardly from opposite sides of each of odd-numbered members of the sense amplifiers, respectively; a pair of bit lines B2 and $\overline{B2}$ extending outwardly from opposite sides of each of even-numbered members of the sense amplifiers, respectively; pluralities of word lines W1 and W2 and two dummy word lines DW1 and DW2 disposed so as to intersect the bit lines B1 and B2 while alternating with each other; and pluralities of word lines W1 and W2 and two dummy word lines DW1 and DW2 disposed so as to intersect the bit lines $\overline{B1}$ and $\overline{B2}$ while alternating with each other. At an intersecting point between each of the bit lines B2 and $\overline{B2}$, connected with the even-numbered sense amplifier 2 and each of the word lines W2, a memory cell M connected with the bit line B2 or the bit line $\overline{B2}$ and also with the associated word line W2 is disposed. Similarly, at an intersecting point between each of the bit lines B1 and $\overline{B1}$, connected with each of the odd-numbered sense amplifiers 1 and 3 and each of the word lines W1, a different memory cell M connected with the bit line B1 or the bit line $\overline{B1}$ and also with the associated word line W1 is disposed. Every other bit line other than those shown has a respective memory cell M. At an intersecting point between the bit line B1, B2, $\overline{B1}$ or $\overline{B2}$ and each of the dummy word lines DW1 and DW2, a dummy cell D connected with the bit line B1, B2, $\overline{B1}$ or $\overline{B2}$ and also with the associated dummy word line DW1 or DW2 is disposed in a manner similar to the respective memory cell M. When a data stored in one of the memory cells, for example, the memory cell indicated by $M_1$ in FIG. 1, is to be read out, the semiconductor memory device of the above described construction operates in the following manner. Namely, when one of the word lines W2 with which the memory cell $M_1$ is connected is selected by an input address signal, one of the dummy cells, for example, the dummy cell $D_1$, which is connected with the bit line $\overline{B2}$ that is paired with the bit line B2 with which the memory cell $M_1$ is connected is charged to a reference potential (which is normally a potential intermediate between "H" and "L") by activating one of the dummy word lines DW2 which is connected with the dummy cell $D_1$. After the bit line B2 and the bit line $\overline{B2}$ have been charged (precharged) to the same potential, the word line W2 and the dummy word line DW2 are activated to permit the memory cell $M_1$ and the dummy cell $D_1$ to conduct with the bit line B2 and the bit line $\overline{B2}$, respectively. By so doing, a potential difference is created between the bit lines B2 and $\overline{B2}$ by the action of the charges stored on the memory cell $M_1$ and the dummy cell $D_1$, respectively, which difference is differentially amplified by the sense amplifier 2 so that one of the bit lines B2 and $\overline{B2}$ of the pair which is held at a higher potential is equalized to the potential of an electric power source and, on the other hand, the other of the bit lines B2 and $\overline{B2}$ of such pair which is held at a lower potential is equalized to a zero potential. Since at this time the memory cells M and the dummy cells D on the bit lines B1 and $\overline{B1}$ connected with the odd-numbered sense amplifiers 1 and 3 are not connected with the word lines W2 and the dummy word lines DW2, they are not conducted to the bit lines B1 and $\overline{B1}$. For this reason, by causing the odd-numbered sense amplifiers 1 and 3 not to be driven, the potential at each of the bit lines B1 and $\overline{B1}$ can be retained at a value equal to the potential attained when the bit lines B1 and $\overline{B1}$ have been precharged. Accordingly, any possible interference noise resulting from a capacitance coupling between the neighboring bit lines B1 and $\overline{B1}$ and between the neighboring bit lines $\overline{B1}$ and $\overline{B2}$ can be advantageously reduced thereby eliminating any possible erroneous operation of the sense amplifier and the data reading speed can be consequently increased.

It is to be noted that the bit lines which are not operative may be connected with a precharging power source or may be held in a floating condition separated from the electric power source.

Figure 2:
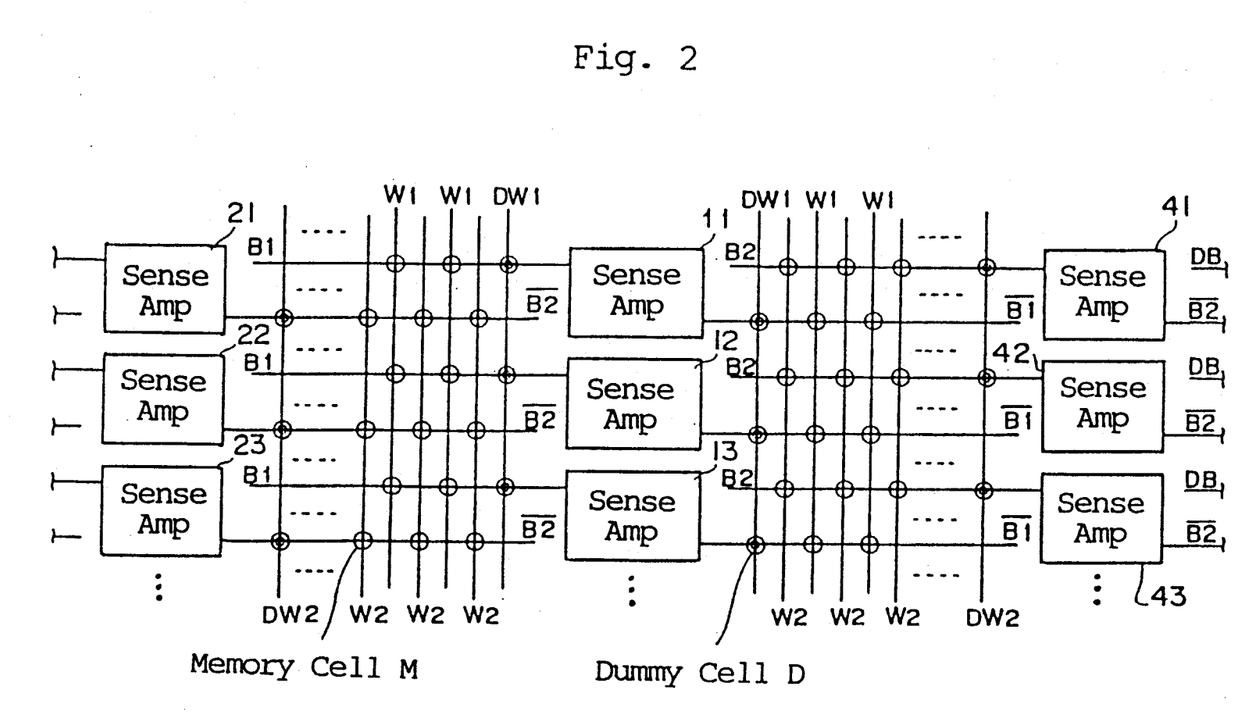

The semiconductor memory device according to a second preferred embodiment of the present invention is shown in FIG. 2. The semiconductor memory device shown therein comprises a first row of a plurality of sense amplifiers (only three of which are shown by 11, 12 and 13), a second row of an equal number of sense amplifiers 21, 22 and 23 lying on one side of the first row of the sense amplifiers 11, 12 and 13, and a third row of an equal number of sense amplifiers 41, 42 and 43 lying on the opposite side of the first row of the sense amplifiers 11, 12 and 13. The bit lines B1 extending in a first direction outwardly from the sense amplifiers 11, 12 and 13 and the bit lines $\overline{B2}$ extending in a second direction, opposite to the first direction, outwardly from the sense amplifiers 21, 22 and 23 are arranged so as to alternate with each other and, at the same time, the bit lines $\overline{B1}$ extending in the second direction outwardly from the sense amplifiers 11, 12 and 13 and the bit lines B2 extending in the first direction outwardly from the sense amplifiers 41, 42 and 43 are arranged so as to alternate with each other. Pluralities of alternating word lines W1 and W2 and two dummy word lines DW1 and DW2 extending so as to intersect the bit lines B1 and $\overline{B2}$, plurality of alternating word lines W1 and W2 and two dummy word lines DW1 and DW2 extending so as to intersect the bit lines B1 and B2, and two dummy word lines are arranged. Also, as is the case with the first preferred embodiment of the present invention shown in FIG. 1, the memory cells M or the dummy cells D connected with the neighboring bit lines B1 and $\overline{B2}$ or $\overline{B1}$ and B2 are connected with the different word lines W1 and W2 or the dummy word lines DW1 and Dw2. It is to be noted that the third row of the sense amplifiers 41, 42 and 43 is the row at one of the opposite extremities and no sense amplifiers exist at the other of the opposite extremities and the bit lines $\overline{B2}$ extending in the second direction outwardly from the sense amplifiers 41, 42 and 43 are arranged so as to alternate with dummy bit lines DB.

According to the second preferred embodiment of the present invention, where the semiconductor memory device is so designed as hereinbefore described, it suffices that all of the sense amplifiers with which the bit lines having the respective memory cells brought into a conductive state are driven and, on the other hand, the sense amplifiers with which the bit lines having the memory cells not brought into the conductive state are not driven, and therefore, as compared with the first preferred embodiment of the present invention, a drive circuit for the sense amplifier can be advantageously simplified. Also, since it suffices that one sense amplifier may be laid out in a width corresponding to two pitches of the bit lines, the design can be simplified.

Figure 3:
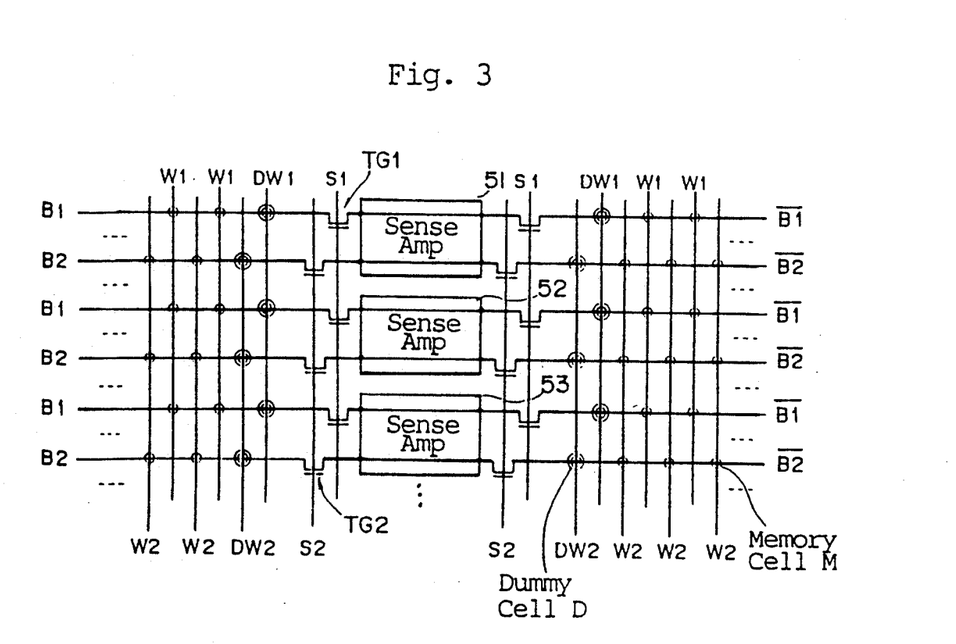

FIG. 3 illustrates the semiconductor memory device according to a third preferred embodiment of the present invention.

Figure 4A:
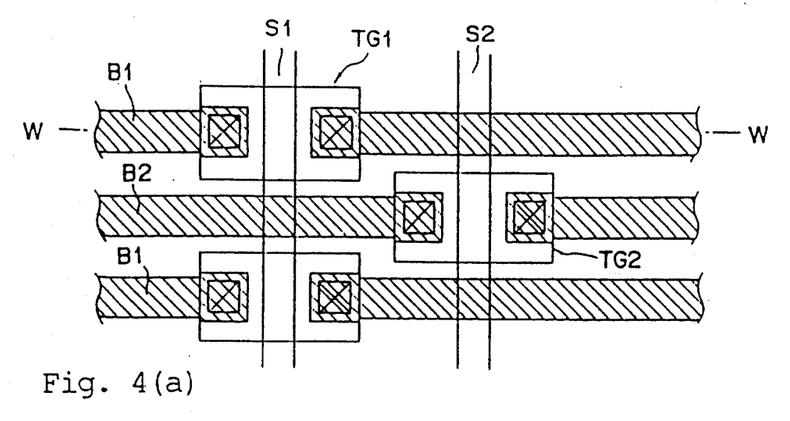
FIG. 4(a) is a schematic diagram showing a structure of a switching element used in the third preferred embodiment of the present invention.
Figure 4B:
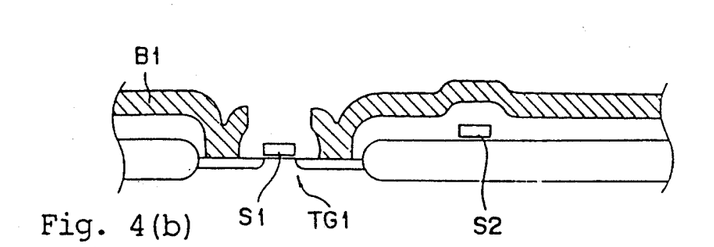
FIG. 4(b) is a cross-sectional view taken along the line W—W in FIG. 4(a)

The semiconductor memory device shown in FIG. 3 comprises a row of sense amplifiers (only three of which are shown by 51, 52 and 53); bit lines B1 and B2 extending parallel to each other and also extending in a first direction from each of the sense amplifiers 51, 52 and 53 through respective switching transistors TG1 and TG2, and bit lines $\overline{B1}$ and $\overline{B2}$ extending parallel to each other and also extending in a second direction, opposite to the first direction, from each of the sense amplifiers 51, 52 and 53 through respective switching transistors TG1 and TG2. The switching transistors TG1 and TG2 associated with each of the sense amplifiers 51, 52 and 53 are laid out on respective sides of the associated sense amplifier, for example, in a manner as shown in FIG. 4(a) and are adapted to be controlled respectively by bit line selection lines S1 and S2 which serve as control gates. Those switching transistors TG1 and TG2 for each sense amplifier 51, 52 and 53 have a channel width two to three times the bit line width for the purpose of minimizing the resistance value. FIG. 4(b) is a cross-sectional view taken along the line W—W in FIG. 4(a) and illustrates a sectional representation of the switching transistor TG1. Also, as shown in FIG. 3, as is the case with the first preferred embodiment of the present invention shown in FIG. 1, the word lines W1 and W2 and the dummy word lines DW1 and DW2 are alternately arranged and the memory cells M and the dummy cells D are disposed at respective intersecting points between the bit lines B1, $\overline{B1}$, B2 and $\overline{B2}$ and the word lines W1 and W2 or the dummy words DW1 and DW2 in alternating fashion as shown in FIG. 3.

When the semiconductor memory device according to the third preferred embodiment of the present invention is desired to be operated, simultaneously with the selection of, for example, a certain word line W1, the bit line selection lines S1 and S1 are to be activated correspondingly and, on the other hand, the bit line selection lines S2 and S2 should be held in an OFF state. In other words, the pairs of the bit lines B1 and $\overline{B1}$ with which the memory cells M are connected are to be connected with the associated sense amplifier 51, 52 and 53 and, on the other hand, the bit line selection lines B2 and $\overline{B2}$ should be separated. Where this arrangement is employed in the semiconductor memory device, and even where all of the sense amplifiers 51, 52 and 53 are driven equally with no distinction given to whether they are odd-numbered or whether they are even-numbered, the bit lines B2 and $\overline{B2}$ neighboring the respective bit lines B1 and $\overline{B1}$ can be maintained at a potential equal to the precharging potential and, therefore, the interference noise resulting from the inter-bit-line coupling capacitance can be reduced. Also, although the space for the installation of the switching transistors TG1 and TG1 increases as compared with the foregoing first embodiment of the present invention, the number of the sense amplifiers can be reduced to half the number employed in the first embodiment of the present invention thereby to facilitate a lay-out of the sense amplifiers. In addition, unlike the second preferred embodiment of the present invention, no dummy bit lines DB is required in the row of the sense amplifiers and, therefore, a space saving can be attained.

Figure 5:
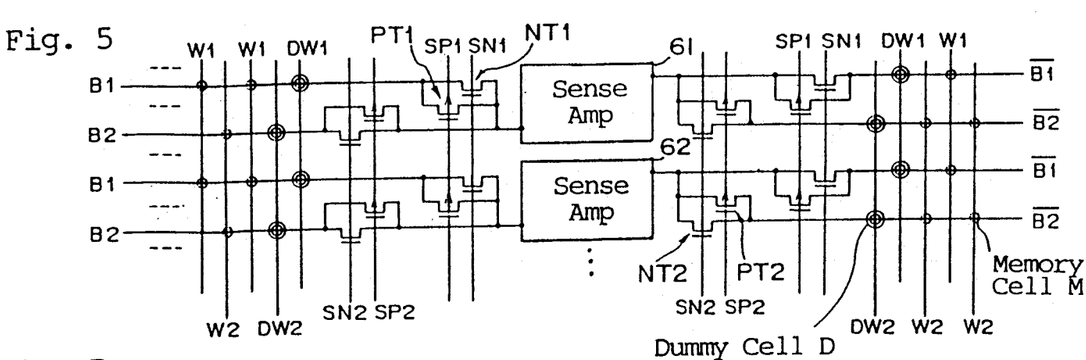

FIG. 5 illustrates the semiconductor memory device according to a fourth embodiment of the present invention.

Figure 6A:
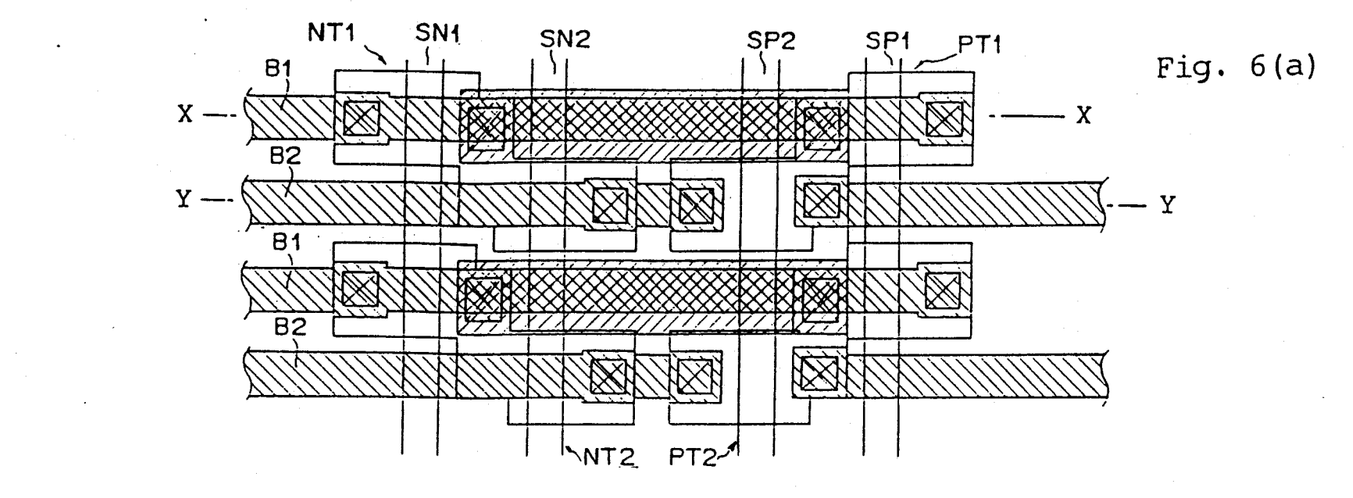
FIG. 6(a) is a schematic diagram showing a structure of the switching element used in the fourth preferred embodiment of the present invention.
Figures 6B, 6C:
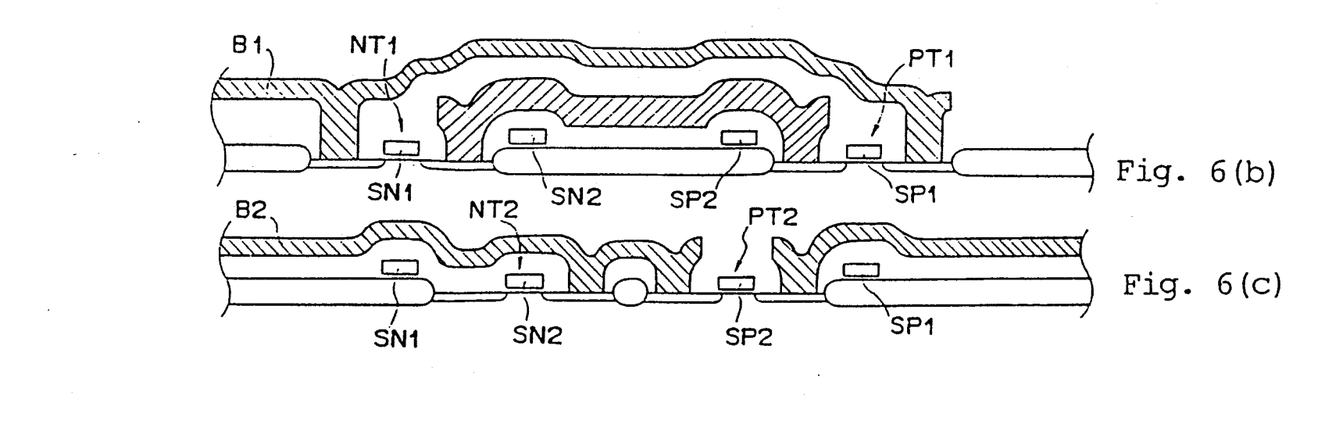
FIGS. 6(b) and 6(c) are cross-sectional views taken along the lines X—X and Y—Y in FIG. 6(a), respectively.

The semiconductor memory device shown in FIG. 5 differs from that according to the third embodiment of the present invention in that, as switching elements corresponding to the switching transistors TG1 and TG2, n-channel transistors NT1 and p-channel transistors PT1 are connected parallel to each other and, similarly, n-channel transistors NT2 and p-channel transistors PT2 are connected parallel to each other. The n-channel transistors NT1 and NT2 and the p-channel transistors PT1 and PT2 are positioned on respective sides of a row of sense amplifiers (two of which are shown by 61 and 62) and are laid out, for example, in a manner as shown in FIG. 6(a) and are adapted to be controlled by respective bit line selection lines SN1, SN2, SP1 and SP2. It is to be noted that FIGS. 6(b) and 6(c) illustrate respective cross-sectional representations taken along the lines X—X and Y—Y used in FIG. 6(a).

In this case, since the p-channel transistors PT1 and PT2 so far as a high potential side is concerned, or the n-channel transistors NT1 and NT2 so far as a low potential side is concerned, have a respective high current driving force, the respective resistance values as the switching elements can further be minimized.

Figure 7:
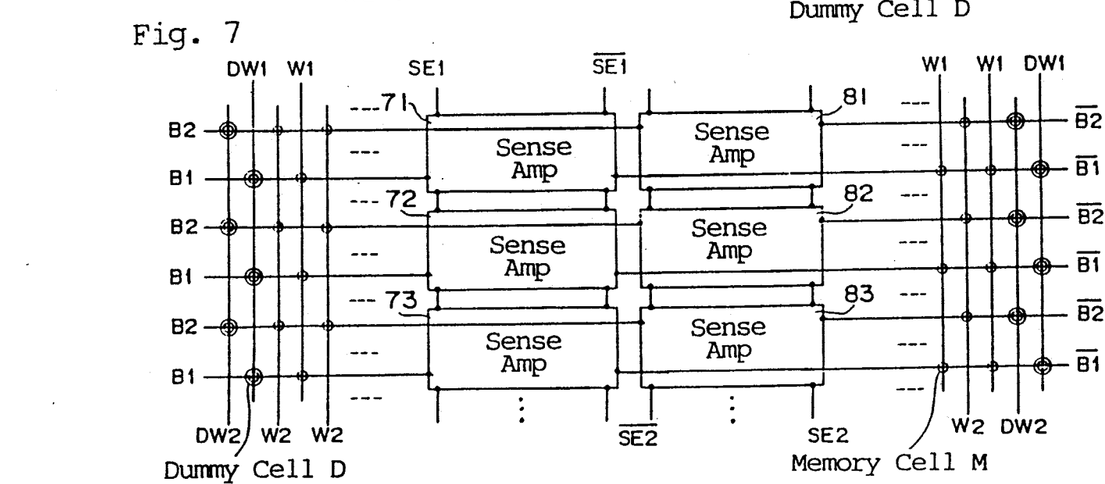

The semiconductor memory device according to a fifth preferred embodiment of the present invention is shown in FIG. 7.

Figure 8A:
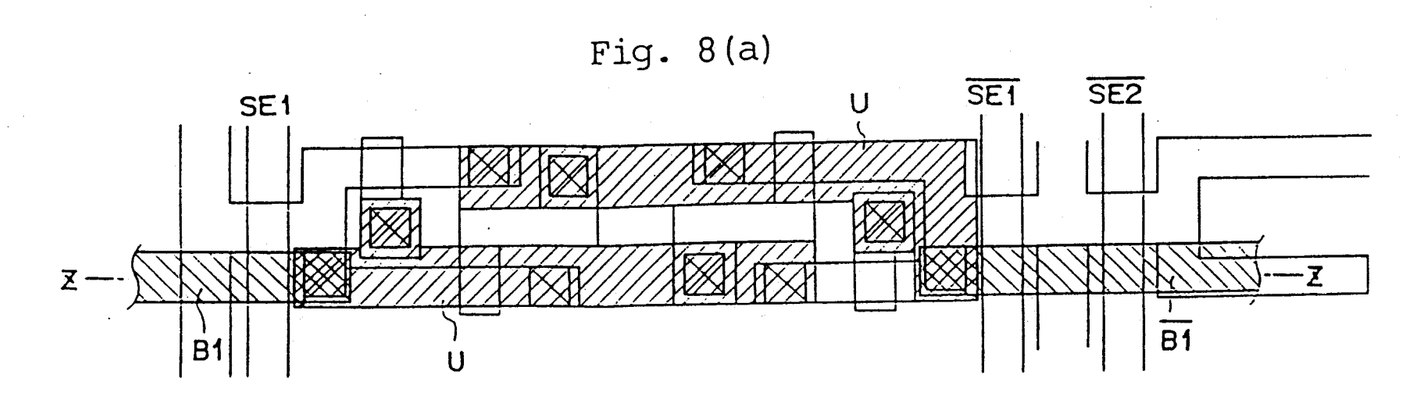
FIG. 8(a) is a schematic diagram showing a structure of the switching element used in the fifth preferred embodiment of the present invention.
Figure 8B:
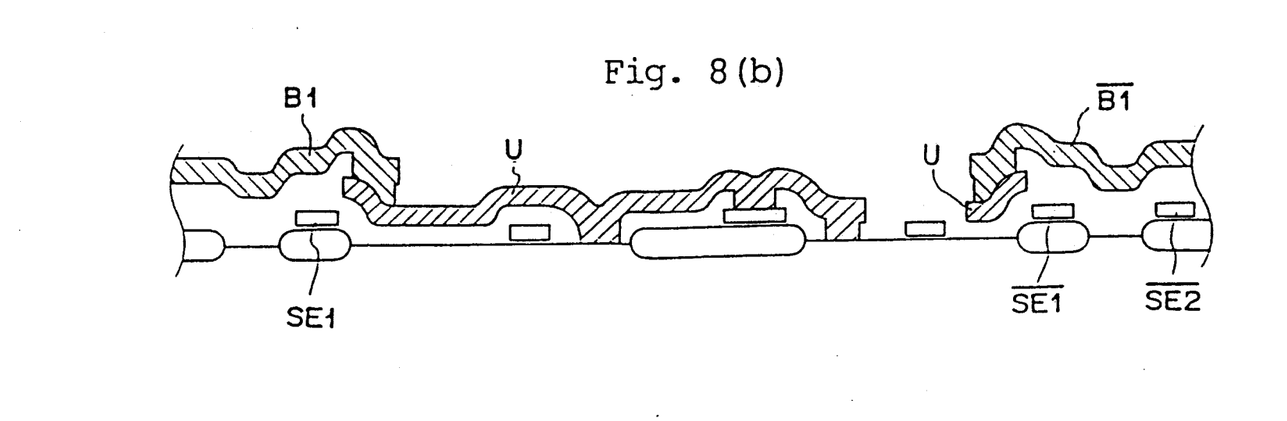
FIG. 8(b) is a cross-sectional view taken along the line Z—Z in FIG. 8(a)

The semiconductor memory device shown in FIG. 7 comprises a row of a plurality of sense amplifiers (three of which are shown by 71, 72 and 73) extending in one direction and another row of a plurality of sense amplifiers (similarly three of which are shown by 81, 82 and 83) neighboring the row of the sense amplifiers 71, 72 and 73, a pair of bit lines B1 and $\overline{B1}$ extending outwardly from opposite sides of each of the sense amplifiers 71, 72 and 73, and a pair of bit lines B2 and $\overline{B2}$ extending outwardly from opposite sides of each of the sense amplifiers 81, 82 and 83. Some of the above described sense amplifiers are laid out, for example, in a manner as shown in FIGS. 8(a) and 8(b) and, by the utilization of capacitor electrodes (plate electrodes) U of the memory cells M as circuit wirings, not utilizing extra wiring, the bit lines B1 and $\overline{B1}$ connected with one sense amplifier are allowed to extend over the neighboring sense amplifier. For facilitating the well formation and the separation of the elements, each neighboring pair of the sense amplifiers are preferably so designed that n-channel sense amplifiers are disposed on respective sides of the memory cells M on the opposite sides of such sense amplifiers and a p-channel sense amplifier is disposed in the vicinity of the center. Also, as is the case with the first preferred embodiment of the present invention, word lines W1 and W2 and dummy word lines DW1 and DW2 are alternately disposed and the memory cells M and the dummy cells D are disposed every other line in alternating fashion.

Then, simultaneously with the selection of a certain word line W1 by an input address signal, sense amplifier drive signal lines SE1 and $\overline{SE1}$ are activated and, on the other hand, sense amplifier drive signal lines SE2 and $\overline{SE2}$ are not activated. In other words, the row of the sense amplifers 71, 72 and 73 are activated while the other row of the sense amplifiers 81, 82 and 83 are not activated. By so doing, the bit lines B2 and $\overline{B2}$ neighboring the respective bit lines B1 and $\overline{B1}$ can be maintained at a potential equal to the precharging potential, thereby reducing the interference noise resulting from the inter-bit-line coupling capacitance. Also, unlike any one of the third and fourth embodiments of the present invention, no consideration need be paid to the resistance value of the switching element interposed between each sense amplifier and the associated bit line. It is to be noted that, while in any one of the first to fourth embodiments of the present invention the dummy cells D are disposed close to the sense amplifiers, the dummy cells D used in the fifth embodiment of the present invention are disposed opposite to the sense amplifiers. However, they may be disposed in any suitable manner and, for example, they may be disposed at the center of the bit line.

Figure 9:
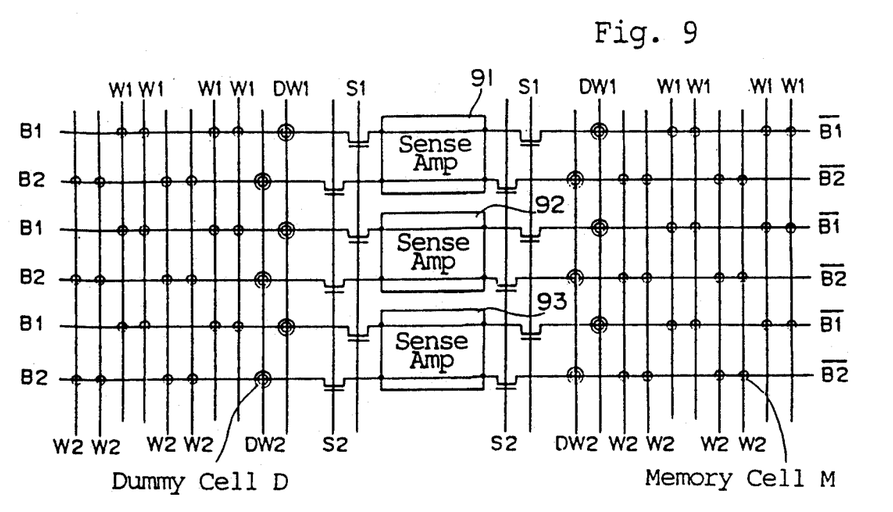

FIG. 9 illustrates the semiconductor memory device according to a sixth preferred embodiment of the present invention.

While in any one of the first to fifth embodiments of the present invention the memory cells M are disposed every other line, the semiconductor memory device shown in FIG. 9 includes pairs of parallel word lines W1 and W1 and pairs of parallel word lines W2 and W2 alternating the respective pairs of the word lines W1 and W1. Two memory cells M are disposed at respective intersecting points between each pair of the word lines W1 and W1 and each bit line B1 or $\overline{B1}$. Similarly, two memory cells M are disposed at respective intersecting points between each pair of the word lines W2 and W2 and each bit line B2 or $\overline{B2}$. Thus, the memory cells M connected with, for example, the bit line B1 are connected with the pair of the word lines W1 and W1 and are not connected with the pair of the word lines W2 and W2. Conversely, the memory cells M connected with the bit line B2 are connected with the pair of the word lines W2 and W2 and are not connected with the pair of the word lines W1 and W1. Other than this, the semiconductor memory device according to the sixth embodiment of the present invention takes a construction similar to that of the semiconductor memory device according to the third embodiment of the present invention.

With this arrangement, the point of connection at which each bit line B1, $\overline{B1}$, B2 and $\overline{B2}$ is connected with the associated memory cell M can be rendered common for each two memory cells and a high integration can be attained due to the space for the installation of the memory cells having been advantageously reduced. It is to be noted that, although in any one of the first to sixth embodiments of the present invention the dummy word lines DW have been activated (a phase-matched dummy word line system) which are disposed on one side of the sense amplifiers opposite to a selection word line W, the present invention is not always limited thereto and the dummy word lines DW on the same side as the selection word line W may be activated by the use of a reverse-phase signal. According to this system, not only can the interference noise between the bit lines and the word lines be counterbalanced, but also the bit line paired with a read-out bit line can be accurately retained at a potential equal to the precharging potential when the precharging potential is selected to be half the potential of the electric power source, resulting in a reduction of the noise and also in an electric power consumption during amplification. In particular, in the case of the open bit line system such as in this semiconductor memory device, a reduction in distance between the selection word line W and the dummy word line DW can advantageously result in a considerable minimization of an unbalance in capacitance between them and the bit lines.

Hereinafter, performances of the semiconductor memory device of the present invention such as the operational stability, the consumed electric power and the reading speed will now be described in comparison with (A) those of the prior art folded bit-line architecture shown in FIG. 13 and (B) those of the prior art twisted bit-line architecture shown in FIG. 14.

(1) With respect to the stability of operation, the potential difference $\Delta V_B$ immediately after the reading between the paired bit lines will be compared hereinafter.

Let it be assumed that the memory cell capacitance is $C_S$, the bit-line total capacitance is $C_B$, the inter-bit-line capacitance is $C_{BB}$, the bit-line-to-substraate capacitance is $C_O(C_O=C_B-C_S-2C_{BB})$, the potential of the memory cell is Vcc, the bit-line precharging voltage is Vp and the respective potentials immediately after the memory cell read-out of the paired bit lines are $V_H$ and $V_L$ ($V_H > V_L$). A charge preservation equation immediately after the word line has been activated and the charge stored in the memory cell has been read out to the bit line will be as follows in the worst case (in which the neighboring bit lines are opposite in phase to each other).

(A) Folded bit-line architecture:

$$C_S(Vcc-Vp)=C_B(V_H-Vp)+2C_{BB}(V_H-V_L)$$

$$0=C_B(V_L-Vp)+2C_{BB}(V_L-V_H)$$

(B) Twisted bit-line architecture:

$$C_S(Vcc-Vp)=C_B(V_H-Vp)+C_{BB}(V_H-V_L)+(V_H-V_L)\cdot C_{BB}/2+(V_H-V_H)\cdot C_{BB}/2$$

$$0=C_B(V_L-Vp)+C_{BB}(V_L-V_H)+(V_L-V_H)\cdot C_{BB}/2+(V_L-V_L)\cdot C_{BB}/2$$

(C) Invention:

$$C_S(Vcc-Vp)=C_B(V_H-Vp)+2C_{BB}(V_H-Vp)$$

$$0=C_B(V_L-Vp)+2C_{BB}(V_L-Vp)$$

Accordingly, the potential difference $\Delta V_B(\Delta V_B=V_H-V_L)$ between the paired bit lines immediately after the reading is expressed as follows.

(A) Folded bit-line architecture:

$$\Delta V_B=[C_S(Vcc-Vp)]/[C_B+4C_{BB}]$$

(B) Twisted bit-line architecture:

$$\Delta V_B=[C_S(Vcc-Vp)]/[C_B+3C_{BB}]$$

(C) Invention:

$$\Delta V_B=[C_S(Vcc-Vp)]/[C_B+2C_{BB}]$$

Figure 10:
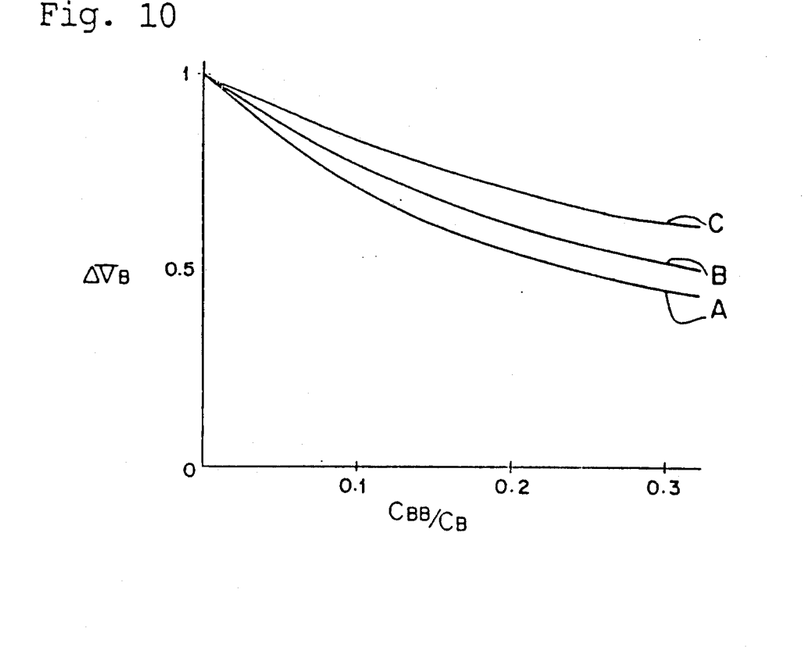
FIGS. 10 and 11 are graphs showing the performances of the semiconductor memory device according to the present invention.

From the foregoing, it will readily be seen that the semiconductor memory device of the present invention exhibits the high potential difference $\Delta V_B$ immediately after the memory cell reading and, accordingly, exhibits a high stability in operation. Also, if the inter-bit-line capacitance $C_{BB}$ in the bit-line total capacitance $C_B$ participates in with increase in capacity of the semiconductor memory device, it will be readily seen that this tendency is considerably. FIG. 10 illustrates results obtained by simulating this tendency and normalizing it. In the graph of FIG. 10, A, B and C represent respective results obtained from the folded bit-line architecture, the twisted bit-line architecture and the system of the present invention. (This is similar even in FIG. 11.) Since a 4-MB dynamic random access memory exhibits about 0.11 for the ratio $C_{BB}/C_B$, the potential difference $\Delta V_B$ exhibited by the present invention will be increased by 18% and 9% as compared with the folded bit-line architecture and the twisted bit-line architecture, respectively. In the case of a 16-MB dynamic random access memory and a 64-MB dynamic random access memory, their ratios $C_{BB}/C_B$ will be expected to be about 0.18 and 0.23, respectively. Because of this, the potential difference $\Delta V_B$ exhibited by the present invention will be increased by 26% and 13% as compared with the folded bit-line architecture and the twisted bit-line architecture, respectively, in the case of the 16-MB DRAM and 32% and 16% as compared with the folded bit-line architecture and the twisted bit-line architecture, respectively, in the case of the 64-MB DRAM. Thus, with a progress of integration, the effects can be increased.

(2) The consumed electric power during the operation of the sense amplifier will now be described.

The amount of movement of charge dQ=CdV of the bit-line pair during the operation of the sense amplifier varies with the system as follows.

(A) Folded bit-line architecture:

$$\begin{aligned} dQ &= C_B(V_{cc} - V_H) + 2C_{BB}(V_{cc} - 0) - \\ &\quad \{C_B(0 - V_L) + 2C_{BB}(0 - V_{cc})\} \\ &= (C_B + 4C_{BB})V_{cc} - C_B(V_H - V_L) \end{aligned}$$

(B) Twisted bit-line architecture:

$$\begin{aligned} dQ &= C_B(V_{cc} - V_H) + C_{BB}(V_{cc} - 0) + \\ &\quad (V_{cc} - 0) \cdot C_{BB}/2 + (V_{cc} - V_{cc}) \cdot C_{BB}/2 - \\ &\quad \{C_B(0 - V_L) + C_{BB}(0 - V_{cc}) + \\ &\quad (0 - 0) \cdot C_{BB}/2 + (0 - V_{cc}) \cdot C_{BB}/2\} \\ &= (C_B + 3C_{BB})V_{cc} - C_B(V_H - V_L) \end{aligned}$$

(C) Invention:

$$\begin{aligned} dQ &= C_B(V_{cc} - V_H) + 2C_{BB}(V_{cc} - V_p) - \\ &\quad \{C_B(0 - V_L) + 2C_{BB}(0 - V_p)\} \\ &= (C_B + 2C_{BB})V_{cc} - C_B(V_H - V_L) \end{aligned}$$

Thus, the amount of movement of charge is smallest in the present invention, followed by the twisted bit-line architecture which is in turn followed by the folded bit-line architecture. Since the consumed electric power is proportional to the amount of movement of the charge, it will readily be seen that the present invention is excellent as compared with any one of the folded and twisted bit-line architectures. According to the present invention, the consumed electric power at the sense amplifier could be reduced by 15% and 8% as compared with the folded bit-line architecture and the twisted bit-line architecture, respectively, in the case of the 4-MB DRAM, and 21% and 12% as compared with the folded bit-line architecture and the twisted bit-line architecture, respectively, in the case of the 16-MB DRAM, and 24% and 14% as compared with the folded bit-line architecture and the twisted bit-line architecture, respectively, in the caseof the 64-MB DRAM.

(3) The reading speed will now be discussed.

In general, a sense amplifier has such a property that the sensitivity thereof tends to be lowered with an increase in a sensing speed. Accordingly, if the potential difference $\Delta V_B$ between the bit line pair immediately after the signal reading increases, the sensing speed can be increased at a high sensitivity. As discussed under the foregoing paragraph (1), the semiconductor memory device of the present invention can provide a high inter-bit-line potential difference, and therefore, a high speed sensing operation can be appreciated correspondingly.

Figure 11:
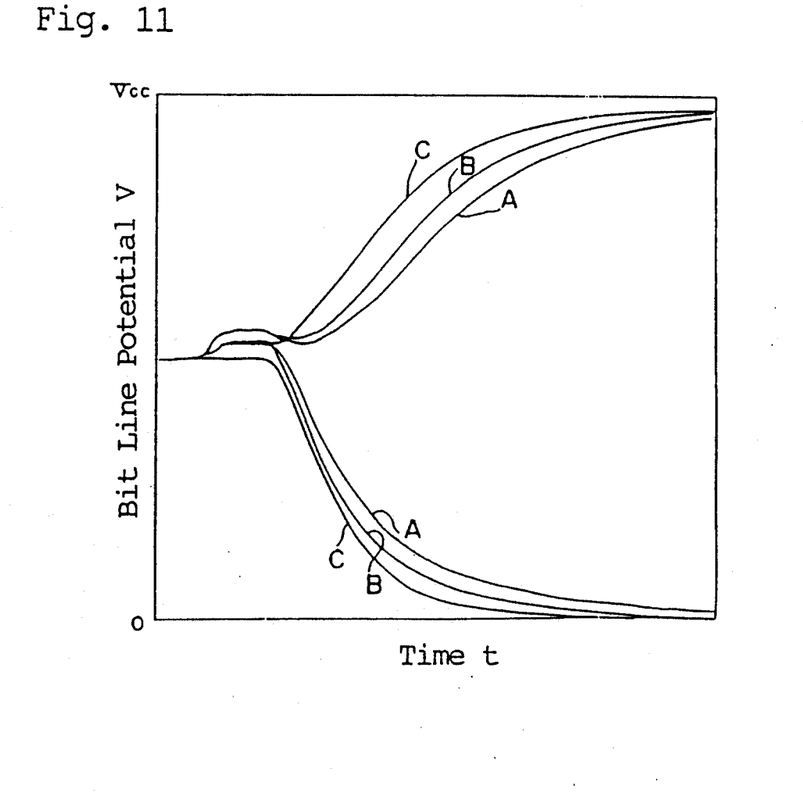

Also, as discussed under the foregoing paragraph (2), since the amount of movement of the charge during the operation of the sense amplifier is small, the amplification speed can be increased for the sense amplifier of the same size. In fact, comparison of the signal reading speed results in that the signal reading speed in the present invention is highest of all, followed by that of the twisted bit-line architecture which is in turn followed by that of the folded bit-line architecture. When a change in bit-line potential during the operation of the sense amplifier was simulated, such measurement results as shown in FIG. 11 could be obtained.

From the foregoing fully description of the present invention, it is clear that the semiconductor memory device of a type comprising a plurality of sense amplifiers of differential type arranged in one direction, a pair of bit lines extending outwardly from opposite sides of each of the sense amplifiers, a plurality of word lines extending in a direction intersecting the bit lines, and a memory cell disposed at each of intersecting points between the bit lines and the word lines is characterized in that the memory cells which are connected respectively with the neighboring bit lines are connected with the different word lines. Therefore, not only can the interference noise between each bit-line pair be reduced, but also any possible erroneous operation can be eliminated, thereby increasing the data reading speed.

Also, where the semiconductor memory device further comprise switches connected with bit-line selection lines disposed between the sense amplifiers and the associated bit lines, wherein each of the switches connected with the neighboring bit lines are connected with the different bit-line selection lines, the control of the switches can result in a reduction of the inter-bit-line interference noise and also in elimination of any possible erroneous operation, thereby increasing the data reading speed.

In addition, where the sense amplifiers are arranged in a plurality of rows with the neighboring bit lines extending outwardly from the sense amplifiers in the neighboring rows, the drive circuit for the sense amplifiers can be simplified.

What is claimed is:

1. A semiconductor memory device which comprises a plurality of sense amplifiers of differential type arranged in one direction, a pair of bit lines extending outwardly from opposite sides of each of the sense amplifiers; a plurality of word lines extending in a direction intersecting the bit lines, and a memory cell disposed at the intersecting points between the bit lines and the word lines, such that said memory cells that are connected with the neighboring bit lines of a said pair are connected with the different word lines.

2. The semiconductor memory device as claimed in claim 1, further comprising switches connected with bit-line selection lines disposed between the sense amplifiers and the associated bit lines, each of the switches connected with the neighboring bit lines being connected with the different bit-line selection lines.

3. The semiconductor memory device as claimed in claim 1, wherein the sense amplifiers are arranged in a plurality of rows with the neighboring bit lines extending outwardly from the sense amplifiers in the neighboring rows.

* * * * *